United States Patent
Takao et al.

(10) Patent No.: US 12,507,507 B2
(45) Date of Patent: Dec. 23, 2025

(54) NITRIDE SEMICONDUCTOR LIGHT-EMITTING ELEMENT

(71) Applicant: NIKKISO CO., LTD., Tokyo (JP)

(72) Inventors: Kazufumi Takao, Ishikawa (JP); Cyril Pernot, Ishikawa (JP)

(73) Assignee: Nikkiso Co., Ltd., Tokyo (JP)

( * ) Notice: Subject to any disclaimer, the term of this patent is extended or adjusted under 35 U.S.C. 154(b) by 399 days.

(21) Appl. No.: 18/326,252

(22) Filed: May 31, 2023

(65) Prior Publication Data

US 2023/0387351 A1 Nov. 30, 2023

(30) Foreign Application Priority Data

May 31, 2022 (JP) ................ 2022-088313

(51) Int. Cl.
*H10H 20/825* (2025.01)
*H10H 20/812* (2025.01)
*H10H 20/816* (2025.01)

(52) U.S. Cl.
CPC ...... *H10H 20/825* (2025.01); *H10H 20/8162* (2025.01); *H10H 20/812* (2025.01)

(58) Field of Classification Search
CPC . H10H 20/825; H10H 20/8162; H10H 20/812
See application file for complete search history.

(56) References Cited

U.S. PATENT DOCUMENTS 10,580,936 B2 3/2020 Nagata
11,616,167 B2 3/2023 Pernot et al.
2013/0082236 A1* 4/2013 Ramer ............. H10H 20/82
257/E33.025
2013/0082273 A1* 4/2013 Ting ............. H10H 20/0133
438/46
2014/0225059 A1 8/2014 Yang et al.
(Continued)

FOREIGN PATENT DOCUMENTS

JP 2008-218746 A 9/2008
JP 2015-050247 A 3/2015
(Continued)

OTHER PUBLICATIONS

Jang, et al., "Effect of Thickness of the p-AlGaN Electron Blocking Layer on the Improvement of ESD Characteristics in GaN-Based LEDs", IEEE Photonics Technology Letters, vol. 20, No. 13, Jul. 1, 2008, pp. 1142-1144.

(Continued)

*Primary Examiner* — Mark W Tornow

(74) *Attorney, Agent, or Firm* — Scully, Scott, Murphy & Presser, P.C.

(57) ABSTRACT

A nitride semiconductor light-emitting element includes an n-type semiconductor layer, an active layer being formed on the n-type semiconductor layer and emitting ultraviolet light, an electron blocking layer formed on the active layer, and a p-type semiconductor layer formed on the electron blocking layer. Pits are formed in the active layer and the electron blocking layer. A density of the pits on an upper surface of the electron blocking layer is not less than $7.0 \times 10^7$ pits/cm$^2$ and not more than $1.8 \times 10^9$ pits/cm$^2$.

5 Claims, 5 Drawing Sheets

(56) References Cited

U.S. PATENT DOCUMENTS

| | | | |
|---|---|---|---|
| 2015/0060762 A1* | 3/2015 | Kim | H10H 20/01335 |
| | | | 438/45 |
| 2016/0380155 A1* | 12/2016 | Jeong | H10H 20/8215 |
| | | | 257/101 |
| 2017/0317235 A1 | 11/2017 | Iguchi et al. | |
| 2018/0138332 A1* | 5/2018 | Du | H10H 20/01335 |
| 2019/0081212 A1 | 3/2019 | Nagata | |
| 2020/0227590 A1 | 7/2020 | Pernot et al. | |
| 2021/0126162 A1 | 4/2021 | Han et al. | |

FOREIGN PATENT DOCUMENTS

| | | |
|---|---|---|
| JP | 2019-054023 A | 4/2019 |
| JP | 2019-054247 A | 4/2019 |
| TW | 201330315 A1 | 7/2013 |
| WO | 2016/072150 A1 | 5/2016 |

OTHER PUBLICATIONS

Japanese Official Action dated Nov. 14, 2023 from related JP 2022-088313 together with English language translation.
Taiwanese Official Action dated Dec. 18, 2023 from related TW 112118028 together with English language translation.
Japanese Official Action dated Aug. 22, 2023 from related JP 2022-088313 together with English language translation.
Japanese Official Action dated Jun. 6, 2023 from related JP 2022-088313 together with English language translation.

* cited by examiner

NITRIDE SEMICONDUCTOR LIGHT-EMITTING ELEMENT

CROSS-REFERENCE TO RELATED APPLICATIONS

The present application is based on Japanese patent application No. 2022-088313 filed on May 31, 2022, the entire contents of which are incorporated herein by reference.

TECHNICAL FIELD

The present invention relates to a nitride semiconductor light-emitting element.

BACKGROUND OF THE INVENTION

Patent Literature 1 discloses a nitride semiconductor light-emitting element in which V-pits, which are a type of crystal defect, are formed in the light-emitting layer. Patent Literature 1 also describes that since the V-pits are formed in a light-emitting layer, occurrence of non-luminescent recombination is suppressed and luminous efficiency is thus improved.

Citation List Patent Literature 1: JP2015-050247A

SUMMARY OF THE INVENTION

In case of the nitride semiconductor light-emitting element described in Patent Literature 1, however, there is room for improvement in terms of improving light output.

The invention was made in view of such circumstances and it is an object of the invention to provide a nitride semiconductor light-emitting element that can achieve improved light output.

To achieve the object described above, the invention provides a nitride semiconductor light-emitting element, comprising:

an n-type semiconductor layer;
an active layer being formed on the n-type semiconductor layer and emitting ultraviolet light;
an electron blocking layer formed on the active layer; and
a p-type semiconductor layer formed on the electron blocking layer,
wherein pits are formed in the active layer and the electron blocking layer, and
wherein a density of the pits on an upper surface of the electron blocking layer is not less than $7.0 \times 10^7$ pits/cm$^2$ and not more than $1.8 \times 10^9$ pits/cm$^2$.

Advantageous Effects of the Invention

According to the invention, it is possible to provide a nitride semiconductor light-emitting element that can achieve improved light output.

DETAILED DESCRIPTION OF THE INVENTION

Embodiment

An embodiment of the invention will be described in reference to FIGS. 1 to 3. The embodiment below is described as a preferred illustrative example for implementing the invention. Although some part of the embodiment specifically illustrates various technically preferable matters, the technical scope of the invention is not limited to such specific aspects.

Nitride Semiconductor Light-Emitting Element 1

Figure 1:
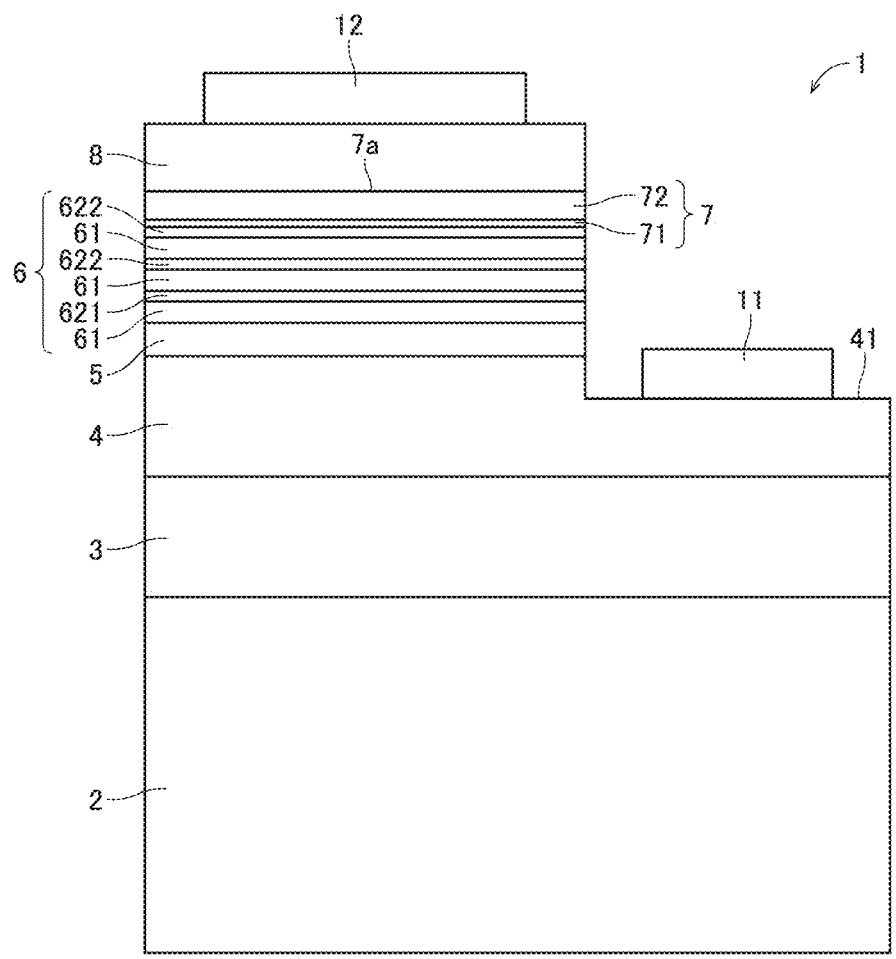
FIG. 1 is a schematic diagram illustrating a configuration of a nitride semiconductor light-emitting element in an embodiment.

FIG. 1 is a schematic diagram illustrating a configuration of a nitride semiconductor light-emitting element 1. In FIG. 1, the scale ratio of each layer of the nitride semiconductor light-emitting element 1 (hereinafter, also simply referred to as "the light-emitting element 1") in a stacking direction is not necessarily the same as the actual scale ratio.

The light-emitting element 1 constitutes, e.g., a light-emitting diode (LED) or a semiconductor laser (LD: laser diode). In the present embodiment, the light-emitting element 1 constitutes a light-emitting diode that emits light with a wavelength in an ultraviolet region. Particularly, the light-emitting element 1 in the present embodiment emits ultraviolet light at a central wavelength of not less than 240 nm and not more than 365 nm. The light-emitting element 1 can be used in fields such as, e.g., sterilization (e.g., air purification, water purification, etc.), medical treatment (e.g., light therapy, measurement/analysis, etc.), UV curing, etc.

The light-emitting element 1 includes a buffer layer 3, an n-type semiconductor layer 4, a composition gradient layer 5, an active layer 6, an electron blocking layer 7 and a p-type semiconductor layer 8 in this order on a substrate 2. The light-emitting element 1 also includes an n-side electrode 11 provided on the n-type semiconductor layer 4, and a p-side electrode 12 provided on the p-type semiconductor layer 8.

As semiconductors constituting the light-emitting element 1, it is possible to use, e.g., binary to quaternary group III nitride semiconductors expressed by $Al_aGa_bIn_{1-a-b}N$ ($0 \le a \le 1$, $0 \le b \le 1$, $0 \le a+b \le 1$). In the present embodiment, binary or ternary group III nitride semiconductors expressed by $Al_cGa_{1-c}N$ ($0 \le c \le 1$) are used as the semiconductors constituting the light-emitting element 1. These group III elements may be partially substituted with boron (B) or thallium (Tl), etc. In addition, nitrogen (N) may be partially substituted with phosphorus (P), arsenic (As), antimony (Sb) or bismuth (Bi), etc.

The substrate 2 is made of a material transparent to light emitted by the active layer 6. The substrate 2 is, e.g., a sapphire ($Al_2O_3$) substrate. An upper surface of the substrate 2 is a c-plane. This c-plane may have an off-angle. Alternatively, e.g., an aluminum nitride (AlN) substrate or an aluminum gallium nitride (AlGaN) substrate, etc., may be used as the substrate 2.

The buffer layer 3 is formed on the substrate 2. In the present embodiment, the buffer layer 3 is made of aluminum nitride. When the substrate 2 is an aluminum nitride substrate or an aluminum gallium nitride substrate, the buffer layer 3 may not be necessarily included. The buffer layer 3 may also include a layer made of undoped $Al_pGa_{1-p}N$ ($0 \leq p \leq 1$) that is formed on the layer made of aluminum nitride.

The n-type semiconductor layer 4 is formed on the buffer layer 3. The n-type semiconductor layer 4 is, e.g., an n-type cladding layer made of $Al_qGa_{1-q}N$ ($0 \leq q \leq 1$) doped with an n-type impurity. In the present embodiment, silicon (Si) is used as the n-type impurity. The same applies to the semiconductor layers containing an n-type impurity other than the n-type semiconductor layer 4. Alternatively, germanium (Ge), selenium (Se) or tellurium (Te), etc., may be used as the n-type impurity. An Al composition ratio (also called AlN mole fraction) q of the n-type semiconductor layer 4 can be, e.g., not less than 50%. Particularly when the active layer 6 has a multiple quantum well structure with plural well layers 621, 622 as described later, the n-type semiconductor layer 4 grows coherently by setting the Al composition ratio q of the n-type semiconductor layer 4 to not less than 50% and light output is improved. The n-type semiconductor layer 4 has a film thickness of, e.g., not less than 1 μm and not more than 3 μm. The n-type semiconductor layer 4 may be a single layer or may have a multilayer structure.

The composition gradient layer 5 is formed on the n-type semiconductor layer 4. The composition gradient layer 5 is made of $Al_rGa_{1-r}N$ ($0 \leq r \leq 1$). In the composition gradient layer 5, an Al composition ratio at each position in an up-and-down direction is higher at an upper position. The composition gradient layer 5 may have, e.g., a very small region in the up-and-down direction (e.g., a region of not more than 5% of the entire composition gradient layer 5 in the up-and-down direction) in which the Al composition ratio does not increase toward the upper side.

The Al composition ratio of a lower end portion of the composition gradient layer 5 is preferably substantially the same (e.g., a difference within 5%) as the Al composition ratio of an upper portion of the n-type semiconductor layer 4 that is adjacent to the composition gradient layer 5 on the lower side. In addition, the Al composition ratio of an upper end portion of the composition gradient layer 5 is preferably substantially the same (e.g., a difference within 5%) as an Al composition ratio of a lower portion of a barrier layer 61 that is adjacent to the composition gradient layer 5 on the upper side. A film thickness of the composition gradient layer 5 can be, e.g., not less than 5 nm and not more than 20 nm.

Figure 2:
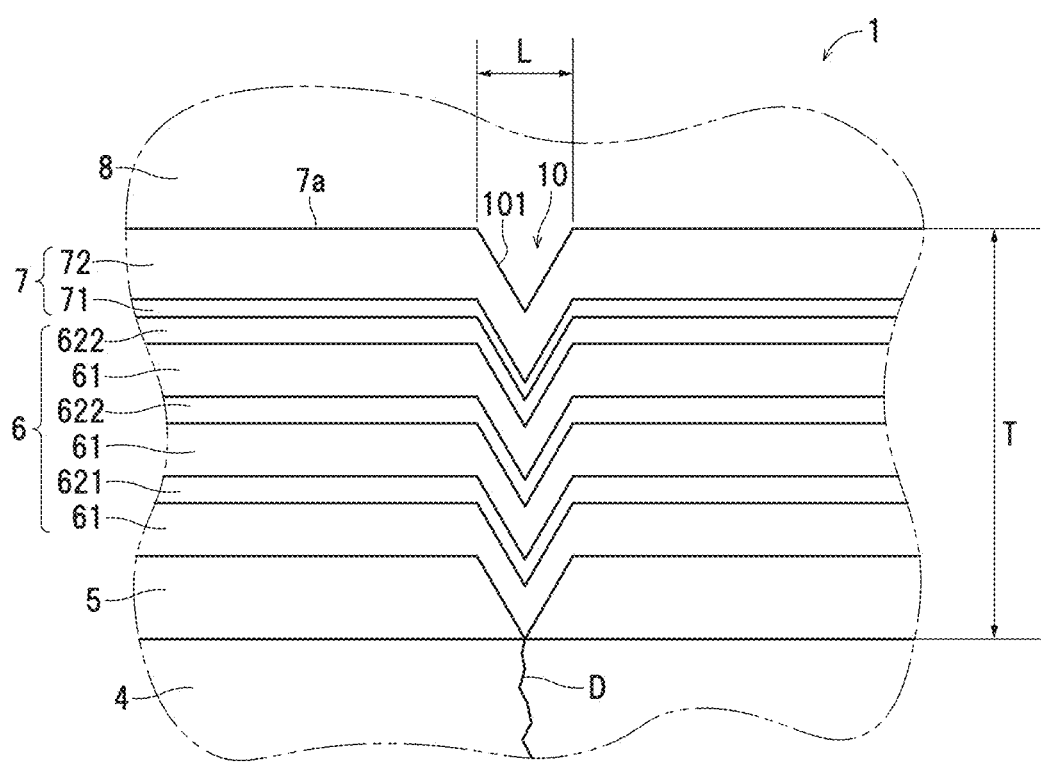
FIG. 2 is a schematic enlarged end view showing the vicinity of a pit in the nitride semiconductor light-emitting element in the embodiment.

FIG. 2 is a schematic enlarged end view showing the vicinity of a pit 10 in the light-emitting element 1. In FIG. 1, illustration of the pits is omitted. The composition gradient layer 5 also serves as a trigger layer from which the pits 10 originate. The trigger layer is a layer containing a high concentration of silicon. It is considered that when a silicon source of not less than a predetermined concentration is supplied to a location where a dislocation D propagated from the n-type semiconductor layer 4 side is present, a growth mode of a matrix of the trigger layer changes and the pit 10 originated from the dislocation D is formed. The details of the pits 10 will be described later.

A silicon concentration in the trigger layer can be adjusted based on a density of the dislocations D present in the n-type semiconductor layer 4 and a target density of the pits 10 on an upper surface 7a of the electron blocking layer 7 (i.e., not less than $7.0 \times 10^7$ pits/$cm^2$ and not more than $1.8 \times 10^9$ pits/$cm^2$). The silicon concentration in the trigger layer can be, e.g., not less than $5.0 \times 10^{18}$ atoms/$cm^3$ and not more than $5.0 \times 10^{19}$ atoms/$cm^3$. A film thickness of the trigger layer can be, e.g., not less than 1 nm and not more than 100 nm. The details of the pits 10 will be described later.

The active layer 6 is formed on the composition gradient layer 5 as the trigger layer. The active layer 6 in the present embodiment has a multiple quantum well structure which includes the plural well layers 621, 622. A band gap of the active layer 6 is adjusted so that ultraviolet light at a central wavelength of not less than 240 nm and not more than 365 nm can be output. When the active layer 6 has a multiple quantum well structure as in the present embodiment, the central wavelength of ultraviolet light emitted by the active layer 6 is preferably not less than 250 nm and not more than 300 nm, more preferably, not less than 260 nm and not more than 290 nm from the viewpoint of improving light output. In the present embodiment, the active layer 6 has three barrier layers 61 and three well layers 621, 622 which are alternately stacked. In the active layer 6, the barrier layer 61 is located at the lower end and the well layer 622 is located at the upper end.

Each barrier layer 61 is made of $Al_sGa_{1-s}N$ ($0 \leq s \leq 1$). The Al composition ratio of each barrier layer 61 is, e.g., not less than 75% and not more than 95%. Each barrier layer 61 has a film thickness of, e.g., not less than 2 nm and not more than 12 nm.

The well layers 621, 622 are made of $Al_tGa_{1-t}N$ ($0 \leq t \leq 1$). An Al composition ratio t of each of the well layers 621, 622 is smaller than the Al composition ratio s of the barrier layers 61 (i.e., $t < s$).

The three well layers 621, 622 are configured such that the lowermost well layer 621, which is the well layer arranged on the lowermost side, has a different configuration from the upper-side well layers 622 which are two well layers other than the lowermost well layer 621. For example, a film thickness of the lowermost well layer 621 is not less than 1 nm greater than a film thickness of each of the two upper-side well layers 622 and an Al composition ratio of the lowermost well layer 621 is not less than 2% greater than an Al composition ratio of each of the two upper-side well layers 622. In the present embodiment, the upper-side well layers 622 have a film thickness of not less than 2 nm and not more than 4 nm and an Al composition ratio of not less than 25% and not more than 45%, and the lowermost well layer 621 has a film thickness of not less than 4 nm and not more than 6 nm and an Al composition ratio of not less than 35% and not more than 55%. A difference between the film thickness of the lowermost well layer 621 and the film thickness of each upper-side well layer 622 can be not less than 2 nm and not more than 4 nm.

By increasing the Al composition ratio of the lowermost well layer 621 to higher than the Al composition ratio of the upper-side well layers 622, crystallinity of the lowermost well layer 621 is improved. This is because the difference in the Al composition ratio between the lowermost well layer 621 and the n-type semiconductor layer 4 is reduced. The improved crystallinity of the lowermost well layer 621 improves crystallinity of each layer formed on and above the lowermost well layer 621 in the active layer 6. As a result, carrier mobility in the active layer 6 is improved and light output is improved. Such effects are more pronounced when the lowermost well layer 621 has a larger film thickness, but the film thickness of the lowermost well layer 621 is designed to be not more than a predetermined value from the viewpoint of suppressing an increase in the electrical resistance value of the entire light-emitting element 1. Alternatively, the plural well layers 621, 622 may be configured such that, e.g., the lower the position of the layer, the higher the Al composition ratio.

The lowermost well layer 621 contains silicon as an n-type impurity. This can also induce formation of the pits 10 in the active layer 6. A silicon concentration in the lowermost well layer 621 is, e.g., not less than $1.0 \times 10^{19}$ atoms/cm$^3$ and not more than $6.0 \times 10^{19}$ atoms/cm$^3$. The upper-side well layers 622 may also contain an n-type impurity such as silicon, and in this case, the lowermost well layer 621 preferably has the highest silicon concentration among the plural well layers 621, 622.

Although the example in which the active layer 6 has a multiple quantum well structure with the three well layers 621, 622 has been described in the present embodiment, it is not limited thereto. The active layer 6 may have a multiple quantum well structure with two or not less than four well layers. When the active layer 6 has a multiple quantum well structure, the number of the well layers is preferably two or three from the viewpoint of improving light output. Alternatively, the active layer 6 may have a single quantum well structure having only one well layer.

The electron blocking layer 7 is formed on the active layer 6. The electron blocking layer 7 serves to improve efficiency of electron injection into the active layer 6 by suppressing occurrence of the overflow phenomenon in which electrons leak from the active layer 6 to the p-type semiconductor layer 8 side (hereinafter, also referred to as the electron blocking effect). The electron blocking layer 7 has a stacked structure in which a first layer 71 and a second layer 72 are stacked in this order from the lower side.

The first layer 71 is provided on the active layer 6. The first layer 71 is made of, e.g., $Al_uGa_{1-u}N$ ($0 \leq u \leq 1$). An Al composition ratio u of the first layer 71 is, e.g., not less than 90%. A film thickness of the first layer 71 is, e.g., not less than 0.5 nm and not more than 5.0 nm.

The second layer 72 is made of, e.g., $Al_vGa_{1-v}N$ ($0 \leq v \leq 1$). An Al composition ratio v of the second layer 72 is smaller than the Al composition ratio t of the first layer 71 (i.e., v<t) and is, e.g., not less than 70% and not more than 90%. A film thickness of the second layer 72 is larger than the film thickness of the first layer 71 and is, e.g., not less than 15 nm and not more than 100 nm.

When the first layer 71 with a relatively high Al composition ratio has an excessively large film thickness, it causes an excessive increase in the electrical resistance value of the entire light-emitting element 1 since a semiconductor layer with a higher Al composition ratio has a higher electrical resistance value. For this reason, the film thickness of the first layer 71 is preferably small to some extent. On the other hand, if the film thickness of the first layer 71 is reduced, it increases the probability that electrons pass through the first layer 71 from the lower side to the upper side due to the tunnel effect. Therefore, in the light-emitting element 1 of the present embodiment, the second layer 72 is formed on the first layer 71 to suppress passage of electrons through the entire electron blocking layer 7.

Each of the first layer 71 and the second layer 72 can be an undoped layer, a layer containing an n-type impurity, a layer containing a p-type impurity, or a layer containing both an n-type impurity and a p-type impurity. Magnesium (Mg) can be used as the p-type impurity, but zinc (Zn), beryllium (Be), calcium (Ca), strontium (Sr), barium (Ba) or carbon (C), etc., may be used other than magnesium. The same applies to the other semiconductor layers containing a p-type impurity. When each electron blocking layer 7 contains an impurity, the impurity in each electron blocking layer 7 may be contained in the entire portion of each electron blocking layer 7 or may be contained in a part of each electron blocking layer 7. The electron blocking layer 7 may be composed of a single layer or may be composed of not less than three layers.

The p-type semiconductor layer 8 is formed on the electron blocking layer 7. In the present embodiment, the p-type semiconductor layer 8 is composed of a p-type contact layer. The p-type contact layer is a layer connected to the p-side electrode 12 (described later) and is made of $Al_wGa_{1-w}N$ ($0 \leq w \leq 1$) doped with a high concentration of a p-type impurity. The p-type semiconductor layer 8 as the p-type contact layer is configured to have a low Al composition ratio to achieve an ohmic contact with the A-side electrode 12, and from such a viewpoint, the p-type semiconductor layer 8 is preferably made of p-type gallium nitride (GaN).

The n-side electrode 11 is formed on an exposed surface 41 of the n-type semiconductor layer 4 which is exposed from the active layer 6 on the upper side. The n-side electrode 11 can be, e.g., a multilayered film formed by sequentially stacking titanium (Ti), aluminum, titanium and gold (Au) on the n-type semiconductor layer 4. When the light-emitting element 1 is flip-chip mounted as described below, the n-side electrode 11 may be composed of a material that can reflect ultraviolet light emitted by the active layer 6.

The p-side electrode 12 is formed on an upper surface of the p-type semiconductor layer 8. The p-side electrode 12 can be, e.g., a multilayered film formed by sequentially stacking nickel (Ni) and gold on the p-type semiconductor layer 8. When the light-emitting element 1 is flip-chip mounted as described below, the p-side electrode 12 may be composed of a material that can reflect ultraviolet light emitted by the active layer 6.

The light-emitting element 1 can be used in a state of being flip-chip mounted on a package substrate (not shown). That is, the light-emitting element 1 is mounted such that a side in the up-and-down direction, which is a side where the n-side electrode 11 and the p-side electrode 12 are provided, faces the package substrate and each of the n-side electrode 11 and the p-side electrode 12 is attached to the package substrate via a gold bump, etc. Light from the flip-chip mounted light-emitting element 1 is extracted on the substrate 2 side (i.e., on the lower side). However, it is not limited thereto and the light-emitting element may be mounted on the package substrate by wire bonding, etc. In addition, although the light-emitting element 1 in the present embodiment is a so-called lateral light-emitting element in which both the n-side electrode 11 and the p-side electrode 12 are provided on the upper side of the light-emitting element 1, the light-emitting element 1 is not limited thereto and may be a vertical light-emitting element. The vertical light-emitting element is a light-emitting element in which the active layer is sandwiched between the n-side electrode and the p-side electrode. In this regard, when the light-emitting element is of the vertical type, the substrate and the buffer layer are preferably removed by laser lift-off, etc.

Next, the pits 10 formed in the active layer 6 and the electron blocking layer 7 will be described in reference to FIGS. 2 and 3. FIG. 3 is an AFM (Atomic Force Microscopy) image showing the upper surface 7a of the electron blocking layer 7 (i.e., an upper surface of the second layer 72). FIG. 3 is also the AFM image of the upper surface 7a of the electron blocking layer 7 in Example 1 (described later).

As shown in FIG. 2, the pit 10 is a type of crystal defect that originates from the dislocation D propagated from the n-type semiconductor layer 4 side. FIG. 2 shows an example in which the pit 10 is formed in the composition gradient layer 5 (i.e., the trigger layer), the active layer 6, and the electron blocking layer 7. That is, the pit 10 shown in FIG. 2 is formed from the composition gradient layer 5 to the upper surface 7a of the electron blocking layer 7. It is considered that a growth mode of a matrix of the composition gradient layer 5 changes when a silicon source of not less than a predetermined concentration is supplied during growth of the composition gradient layer to locations where the dislocations D propagated from the n-type semiconductor layer 4 side are present, and the pits 10 are thereby formed. A portion of an upper surface of the composition gradient layer 5 is recessed and each of the active layer 6, the first layer 71 and the second layer 72 located thereon is recessed along the recess on the upper surface of the composition gradient layer 5, and the pit 10 is thereby formed. A thickness T of the pit 10 formed to the upper surface 7a of the electron blocking layer 7 is, e.g., not less than 10 nm and not more than 60 nm. The thickness T of the pit 10 means a length in the up-and-down direction from the point of origin of the pit 10 to the upper surface 7a of the electron blocking layer 7.

Figure 3:
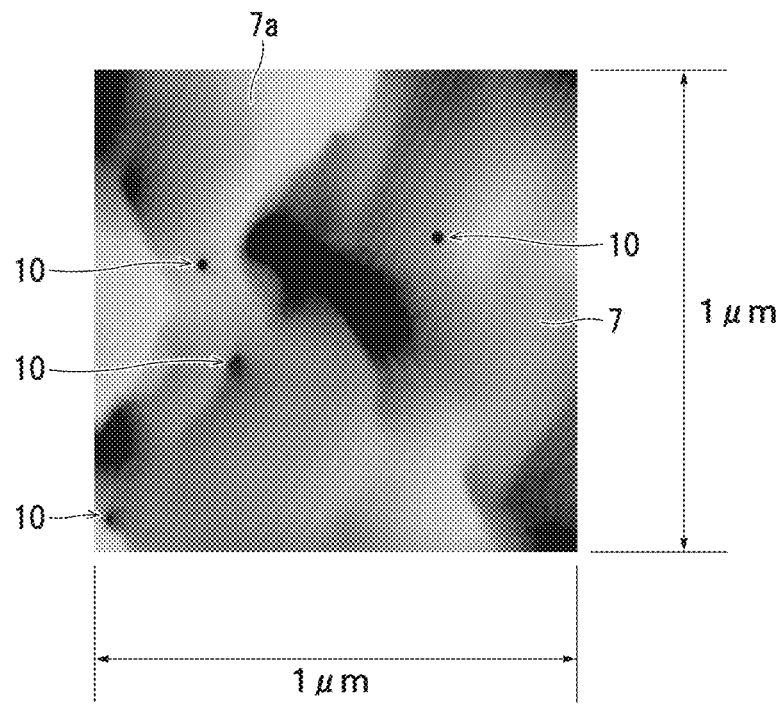
FIG. 3 is an AFM image showing an upper surface of an electron blocking layer in the embodiment and Example 1.

As can be seen in FIG. 3, the upper surface 7a of the electron blocking layer 7 is dotted with the pits 10. Light output of the light-emitting element 1 is improved when a density of the pits 10 on the upper surface 7a of the electron blocking layer 7 is not less than $7.0 \times 10^7$ pits/cm$^2$ and not more than $1.8 \times 10^9$ pits/cm$^2$. It is easier to further improve the light output when the density of the pits 10 on the upper surface 7a of the electron blocking layer 7 further satisfies not more than $1.0 \times 10^9$ pits/cm$^2$. Pits of, e.g., relatively small size which terminate in the active layer 6 unlike the pits 10 shown in FIG. 2 may be present, but the density of the pits 10 on the upper surface 7a of the electron blocking layer 7 here means the density of the pits 10 formed to the upper surface 7a of the electron blocking layer 7 without counting such pits terminating in the active layer 6. Since the pits 10 are formed to the upper surface 7a of the electron blocking layer 7, electron holes (holes) are easily supplied from the p-type semiconductor layer 8 to the active layer 6 through the pits 10. However, a too high density of the pits 10 on the upper surface 7a of the electron blocking layer 7 causes a decrease in the light output. Therefore, as described above, the light output is improved by setting the density of the pits 10 on the upper surface 7a of the electron blocking layer 7 to not less than $7.0 \times 10^7$ pits/cm$^2$ and not more than $1.8 \times 10^9$ pits/cm$^2$, preferably not more than $1.0 \times 10^9$ pits/cm$^2$.

A portion constituting the pit 10 in each semiconductor layer is recessed so that a cross section parallel to the up-and-down direction has a substantially V-shape. A recess surface 101 of the pit 10, which is visible when viewing the upper surface 7a of the electron blocking layer 7, has a substantially V-shape in a cross section parallel to the up-and-down direction, and as a whole, has a substantially cone or pyramid shape (e.g., a substantially cone shape, a substantially polygonal pyramid shape, an elliptic cone shape), or a substantially truncated cone or pyramid shape, which decreases in size toward the lower side. The pit 10 with the recess surface 101 having a V-shaped cross section as described above is called a V-pit. The shape of the recess surface 101 may be a circular column shape or a polygonal column shape, other than that having a V-shaped cross section. In addition, a diameter L of the pit 10 on the upper surface 7a of the electron blocking layer 7 can be not more than 100 nm, more specifically, not less than 20 nm and not more than 60 nm. When the recess surface 101 of the pit 10 has a shape other than a cone, such as a polygonal pyramid, the diameter L can be a diameter of a circle obtained when the shape of the pit 10 on the upper surface 7a of the electron blocking layer 7 is approximated by a circumscribed circle, etc. A portion of the p-type semiconductor layer 8 fills inside the recess surface 101 of the pit 10. Although the example in which the pit 10 is formed from the composition gradient layer 5 is shown in FIG. 2, there may be a case where the pits 10 are formed from the lowermost well layer 621 with high silicon concentration to the upper surface 7a of the electron blocking layer 7.

Method for Manufacturing the Nitride Semiconductor Light-Emitting Element 1

Next, an example of a method for manufacturing the light-emitting element 1 in the present embodiment will be described.

In the present embodiment, the buffer layer 3, the n-type semiconductor layer 4, the composition gradient layer 5, the active layer 6, the electron blocking layer 7 and the p-type semiconductor layer 8 are epitaxially grown on the disc-shaped substrate 2 in this order by the Metal Organic Chemical Vapor Deposition (MOCVD) method. That is, in the present embodiment, the disc-shaped substrate 2 is placed in a chamber and each layer is formed on the substrate 2 by introducing source gases of each layer to be formed on the substrate 2 into the chamber. As the source gases to epitaxially grow each layer, it is possible to use trimethylaluminum (TMA) as an aluminum source, trimethylgallium (TMG) as a gallium source, ammonia (NH$_3$) as a nitrogen source, tetramethylsilane (TMSi) as a silicon source, and biscyclopentadienylmagnesium (Cp$_2$Mg) as a magnesium source.

In forming the composition gradient layer 5, an amount of the silicon source supplied to the chamber is adjusted so that the density of the pits 10 on the upper surface 7a of the electron blocking layer 7 is not less than $7.0 \times 10^7$ pits/cm$^2$ and not more than $1.8 \times 10^9$ pits/cm$^2$. The other manufacturing conditions for epitaxially growing each layer, such as growth temperature, growth pressure and growth time, etc., can be general conditions according to the configuration of each layer.

The MOCVD method is sometimes called the Metal Organic Vapor Phase Epitaxy (MOVPE) method. To epitaxially grow each layer on the substrate 2, it is also possible to use another epitaxial growth method such as the Molecular Beam Epitaxy (MBE) method or the Hydride Vapor Phase Epitaxy (HVPE) method, etc.

After forming each layer on the disc-shaped substrate 2, a mask is formed on a portion of the p-type semiconductor layer 8, i.e., a part other than the portion to be the exposed surface 41 of the n-type semiconductor layer 4. Then, the region in which the mask is not formed is removed by etching from the upper surface of the p-type semiconductor layer 8 to the middle of the n-type semiconductor layer 4 in the up-and-down direction. The exposed surface 41 exposed upward is thereby formed on the n-type semiconductor layer 4. After forming the exposed surface 41, the mask is removed.

Subsequently, the n-side electrode 11 is formed on the exposed surface 41 of the n-type semiconductor layer 4 and the p-side electrode 12 is formed on the p-type semiconductor layer 8. The n-side electrode 11 and the p-side electrode 12 may be formed by, e.g., a well-known method such as the electron beam evaporation method or the sputtering method. The object completed through the above process is cut into pieces with a desired dimension. Plural light-emitting elements 1 as shown in FIG. 1 are thereby obtained from one wafer.
Functions and Effects of the Embodiment In the present embodiment, the density of the pits 10 on the upper surface 7a of the electron blocking layer 7 is not less than $7.0 \times 10^7$ pits/cm$^2$ and not more than $1.8 \times 10^9$ pits/cm$^2$. Therefore, electron holes are easily supplied from the p-type semiconductor layer 8 to the active layer 6 through the pits 10, and the light output of the light-emitting element 1 is improved. Furthermore, when the density of the pits 10 on the upper surface 7a of the electron blocking layer 7 further satisfies not less than $7.0 \times 10^7$ pits/cm$^2$ and not more than $1.0 \times 10^9$ pits/cm$^2$, the light output of the light-emitting element 1 can be further improved.

In addition, the pits 10 formed to the upper surface 7a of the electron blocking layer 7 have the thickness T of not less than 10 nm and not more than 60 nm. In addition, the pits 10 formed to the upper surface 7a of the electron blocking layer 7 have the diameter L of not more than 100 nm at the position of the upper surface 7a of the electron blocking layer 7. It has been confirmed that the light-emitting element 1 with high light output can be obtained when the configuration of the pits 10 satisfies such conditions.

In addition, the p-type semiconductor layer 8 is a p-type contact layer in contact with the electron blocking layer 7. Therefore, electron holes efficiently move from the p-type contact layer, which is connected to the p-side electrode 12, to the electron blocking layer 7 through the pits 10, and the light output of the light-emitting element 1 is improved.

As described above, according to the present embodiment, it is possible to provide a nitride semiconductor light-emitting element that can achieve improved light output.
Experiment Example In this Experimental Example, a relationship between the density of the 10 pits on the upper surface 7a of the electron blocking layer 7 and the light output was confirmed. Among the reference signs used hereinafter, the same reference signs as those used in the above-mentioned embodiment indicate the same constituent elements, etc., as those in the above-mentioned embodiment, unless otherwise specified.

Samples prepared in this Experiment Example were plural wafers that have the same basic structure as the light-emitting element described in the embodiment but have different densities of the pits 10 on the upper surface 7a of the electron blocking layer 7. The configuration of each sample is shown in Table 1.

TABLE 1

| Structure | | Film thickness | Al composition ratio [%] | Si concentration [atoms/cm$^3$] |
|---|---|---|---|---|
| Substrate | | 430 ± 25 [um] | — | BG |
| Buffer layer | | 2000 ± 200 [nm] | 100 | BG |
| n-type semiconductor layer | | 2000 ± 200 [nm] | 55 ± 10 | $(1.50 \pm 1.00)\text{E}+19$ |
| Composition gradient layer | | 15 ± 5 [nm] | 55→85 | BG Peak Si concentration in Lowermost well layer |
| Active layer (3QW) | Barrier layer | 7 ± 5 [nm] | 85 ± 10 | BG Peak Si concentration in Lowermost well layer |
| | Well layer (Lowermost well layer) | 5 ± 1 [nm] | 45 ± 10 | $(3.50 \pm 2.50)\text{E}+19$ |
| | Barrier layer | 7 ± 5 [nm] | 85 ± 10 | BG Peak Si concentration in Lowermost well layer |
| | Well layer (Upper-side well layer) | 3 ± 1 [nm] | 35 ± 10 | BG-1.00E+19 |
| | Barrier layer | 7 ± 5 [nm] | 85 ± 10 | BG-1.00E+19 |
| | Well layer (Upper-side well layer) | 3 ± 1 [nm] | 35 ± 10 | BG-1.00E+18 |
| Electron blocking layer | First layer | 2 ± 1 [nm] | 95 ± 5 | BG |
| | Second layer | 20 ± 10 [nm] | 80 ± 10 | BG |
| P-type semiconductor layer | | 700 ± 100 [nm] | 0 | BG |

The film thickness of each layer shown in Table 1 was measured by a transmission electron microscope. The Al composition ratio of each layer shown in Table 1 is a value estimated from secondary ion intensity of Al measured by Secondary Ion Mass Spectrometry (SIMS). The figures in the column for Composition gradient layer in Table 1 show that the Al composition ratio of the composition gradient layer along the up-and-down direction changes from 55% to 85% from the lower end to the upper end. In addition, in Table 1, "BG" in the column for Si concentration (i.e., silicon concentration) of each layer means the background level. The background-level silicon concentration is a silicon concentration that would be detected when not doped with silicon.

The relationship between the density of the pits 10 on the upper surface 7a of the electron blocking layer 7 and the light output was examined for each sample.

Here, a method for obtaining the density of the pits 10 on the upper surface 7a of the electron blocking layer 7 is described. First, each sample is formed up to the electron blocking layer 7 and is then taken out of the chamber. Then, given three 1 μm-square regions on the upper surface 7a of the electron blocking layer 7 are photographed by AFM. The density of the pits 10 is then calculated from each of the three AFM images. When, e.g., four pits 10 are found in a 1 μm-square AFM image as in FIG. 3, the density of the pits 10 obtained from this AFM image is 4 [pits/μm$^2$]=$4 \times 10^8$ [pits/cm$^2$]. Then, an average of the densities of the pits 10 respectively calculated from the three AFM images was used as the observation result of the density of the pits 10 on the upper surface 7a of the electron blocking layer 7. The density of the pits 10 on the upper surface 7a of the electron blocking layer 7 of each sample was calculated by such a method. The density of the pits 10 on the upper surface 7a of the electron blocking layer 7 of each sample is the average of the densities of the pits 10 observed and obtained from three AFM images in this Experimental Example, but may be an average of the densities of the pits 10 observed and obtained from, e.g., not less than four AFM images.

Figure 4:
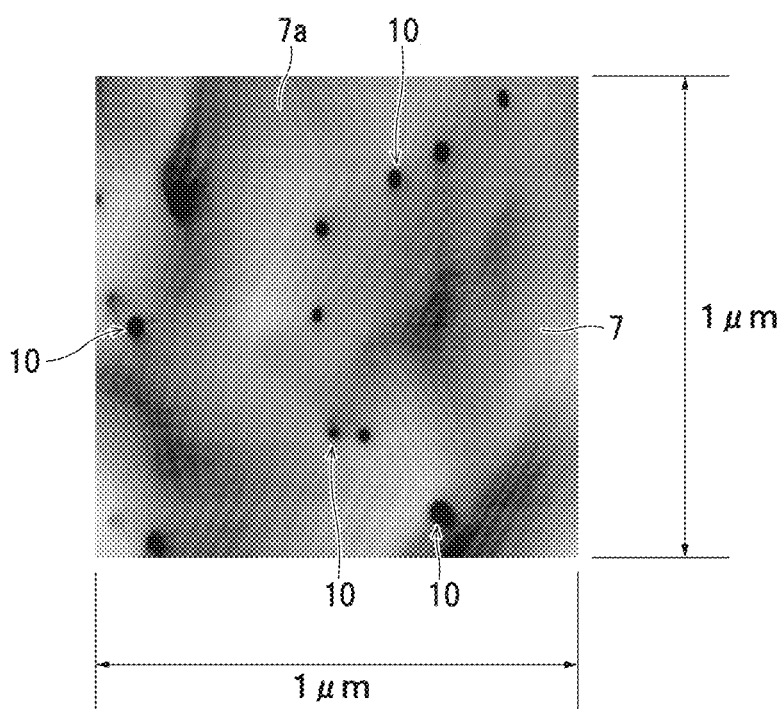
FIG. 4 is an AFM image showing an upper surface of an electron blocking layer in Example 2.
Figure 5:
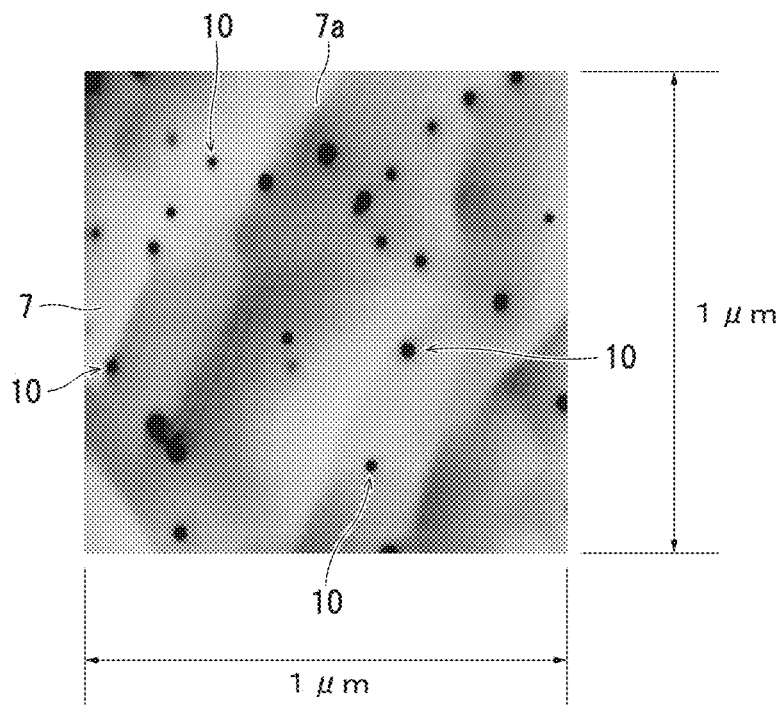
FIG. 5 is an AFM image showing an upper surface of an electron blocking layer in Comparative Example 1.
Figure 6:
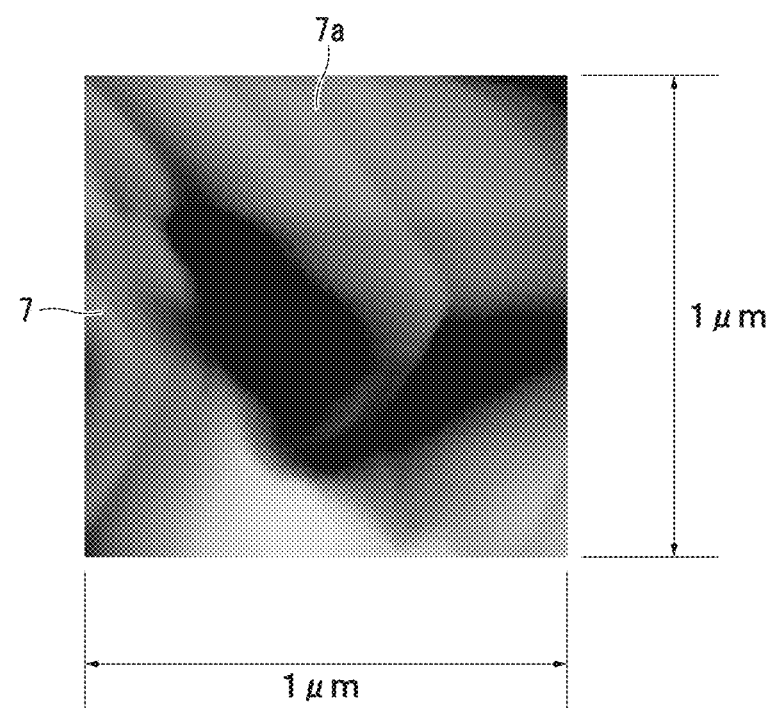
FIG. 6 is an AFM image showing an upper surface of an electron blocking layer in Comparative Example 2.

As examples of the AFM image described above, FIGS. 3 to 6 show two AFM images related to Examples 1 and 2 in which the density of the pits 10 on the upper surface 7a of the electron blocking layer 7 satisfies the numerical range of not less than $7.0 \times 10^7$ pits/cm$^2$ and not more than $1.8 \times 10^9$ pits/cm$^2$ described in the embodiment, and two AFM images related to Comparative Examples 1 and 2 which do not satisfy this numerical range. FIG. 3 is an AFM image of a sample in Example 1, FIG. 4 is an AFM image of a sample in Example 2, FIG. 5 is an AFM image of a sample in Comparative Example 1, and FIG. 6 is an AFM image of a sample in Comparative Example 2. Comparative Example 1 is an example in which the density of the pits 10 on the upper surface 7a of the electron blocking layer 7 is higher than the numerical range described above, and Comparative Example 2 is an example in which no pits 10 are present on the upper surface 7a of the electron blocking layer 7.

After photographing the upper surface 7a of the electron blocking layer 7 of each sample, each sample was returned to the chamber again and the p-type semiconductor layer 8 was regrown on the electron blocking layer 7 of each sample, thereby completing each sample. Then, the light output when applying a current of 20 mW to each sample in the on-wafer state was measured. Measurement of the light output was conducted by a photodetector placed under each sample (placed on the substrate side).

Figure 7:
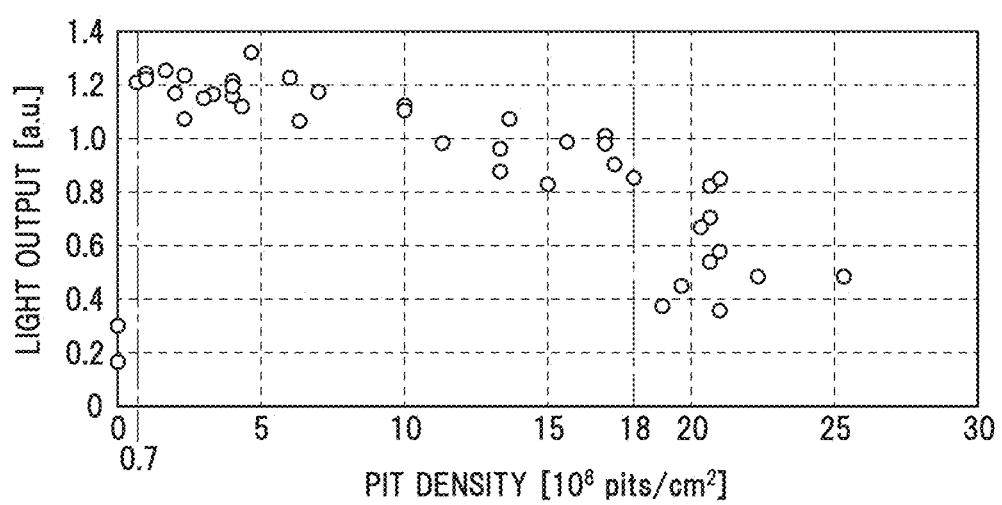
FIG. 7 is a graph showing a relationship between a pit density on the upper surface of the electron blocking layer and light output in Experimental Example.

The results are shown in FIG. 7 and Table 2 below. In FIG. 7, the horizontal axis indicates the density of the pits 10 on the upper surface 7a of the electron blocking layer 7 and the vertical axis indicates the light output. In Table 2, the results of Examples 1, 2 and Comparative Examples 1, 2 out of all samples are shown together with the emission wavelengths. In this regard, the emission wavelengths of the samples other than Examples 1, 2 and Comparative Examples 1, 2 were also around 280 nm in the similar manner to Examples 1, 2 and Comparative Examples 1, 2. In addition, in Examples 1, 2 and Comparative Example 1 in which the presence of the pits 10 was confirmed, the pits 10 were V-pits having a V-shaped cross section.

TABLE 2

|  | Pit density [$10^8$ pits/cm$^2$] | Emission wavelength [nm] | Light output [a.u.] |
| --- | --- | --- | --- |
| Example 1 | 4 | 280.97 | 1.24 |
| Example 2 | 14 | 280.97 | 0.88 |
| Comparative Example 1 | 29 | 282.57 | 0.48 |
| Comparative Example 2 | 0 | 281.77 | 0.20 |

As can be seen in FIG. 7, the samples in which the density of the pits 10 on the upper surface 7a of the electron blocking layer 7 is not less than $7.0 \times 10^7$ pits/cm$^2$ and not more than $1.8 \times 10^9$ pits/cm$^2$ have high light output. On the other hand, the samples in which the density of the pits 10 on the upper surface 7a of the electron blocking layer 7 is out of the range of not less than $7.0 \times 10^7$ pits/cm$^2$ and not more than $1.8 \times 10^9$ pits/cm$^2$ tend to have low light output. Furthermore, it is understood from FIG. 7 that the light output is more likely to be improved when the density of the pits 10 on the upper surface 7a of the electron blocking layer 7 further satisfies not less than $7.0 \times 10^7$ pits/cm$^2$ and not more than $1.0 \times 10^9$ pits/cm$^2$.

For the samples in which the density of the pits 10 on the upper surface 7a of the electron blocking layer 7 is less than $7.0 \times 10^7$ pits/cm$^2$, it was practically difficult to accurately calculate the density of the pits 10 on the upper surface 7a of the electron blocking layer 7. To observe the pits 10 formed on the upper surface 7a of the electron blocking layer 7, it is necessary to magnify and observe a small area of about 1 μm square by AFM, etc. However, in case of the samples in which the density of the pits 10 on the upper surface 7a of the electron blocking layer 7 is less than $7.0 \times 10^7$ pits/cm$^2$, the pits 10 are often not observed even when three or more locations on the upper surface 7a of the electron blocking layer 7 are photographed by AFM. Therefore, it was practically difficult to accurately calculate the density of the pits 10 for the samples in which the density of the pits 10 on the upper surface 7a of the electron blocking layer 7 is more than 0 pit/cm$^2$ and less than $7.0 \times 10^7$ pits/cm$^2$.

Summary of the Embodiment

Technical ideas understood from the embodiment will be described below citing the reference signs, etc., used for the embodiment. However, each reference sign, etc., described below is not intended to limit the constituent elements in the claims to the members, etc., specifically described in the embodiment.

The first feature of the invention is a nitride semiconductor light-emitting element 1 including an n-type semiconductor layer 4; an active layer 6 being formed on the n-type semiconductor layer 4 and emitting ultraviolet light; an electron blocking layer 7 formed on the active layer 6; and a p-type semiconductor layer 8 formed on the electron blocking layer 7, wherein pits 10 are formed in the active layer 6 and the electron blocking layer 7, and wherein a density of the pits 10 on an upper surface 7a of the electron blocking layer 7 is not less than $7.0 \times 10^7$ pits/cm$^2$ and not more than $1.8 \times 10^9$ pits/cm$^2$.

The light output of the nitride semiconductor light-emitting element 1 is thereby improved.

The second feature of the invention is that, in the first feature, the density of the pits 10 on the upper surface 7a of the electron blocking layer 7 further satisfies not more than $1.0 \times 10^9$ pits/cm$^2$.

The light output of the nitride semiconductor light-emitting element 1 is thereby further improved.

The third feature of the invention is that, in the first or second feature, the pits 10 formed to the upper surface 7a of the electron blocking layer 7 have a thickness T of not less than 10 nm and not more than 60 nm.

The light output of the nitride semiconductor light-emitting element 1 is thereby improved.

The fourth feature of the invention is that, in the any one of the first to third features, the pits 10 formed to the upper surface 7a of the electron blocking layer 7 have a diameter L of not more than 100 nm at a position of the upper surface 7a of the electron blocking layer 7.

The light output of the nitride semiconductor light-emitting element 1 is thereby improved.

The fifth feature of the invention is that, in the any one of the first to fourth features, the p-type semiconductor layer 8 is composed of a p-type contact layer in contact with the electron blocking layer 7.

The light output of the nitride semiconductor light-emitting element 1 is thereby improved.

Additional Note

Although the embodiment of the invention has been described, the invention according to claims is not to be limited to the embodiment described above. Further, please note that not all combinations of the features described in the embodiment are necessary to solve the problem of the invention. In addition, the invention can be appropriately modified and implemented without departing from the gist thereof.

The invention claimed is:

1. A nitride semiconductor light-emitting element, comprising:
an n-type semiconductor layer,
an active layer being formed on the n-type semiconductor layer and emitting ultraviolet light;
an electron blocking layer formed on the active layer; and
a p-type semiconductor layer formed on the electron blocking layer,
wherein pits are formed in the active layer and the electron blocking layer, and
wherein a density of the pits on an upper surface of the electron blocking layer is not less than $7.0 \times 10^7$ pits/cm$^2$ and not more than $1.8 \times 10^9$ pits/cm$^2$.

2. The nitride semiconductor light-emitting element according to claim 1, wherein the density of the pits on the upper surface of the electron blocking layer further satisfies not more than $1.0 \times 10^9$ pits/cm$^2$.

3. The nitride semiconductor light-emitting element according to claim 1, wherein the pits formed to the upper surface of the electron blocking layer have a thickness of not less than nm and not more than 60 nm.

4. The nitride semiconductor light-emitting element according to claim 1, wherein the pits formed to the upper surface of the electron blocking layer have a diameter of not more than 100 nm at a position of the upper surface of the electron blocking layer.

5. The nitride semiconductor light-emitting element according to claim 1, wherein the p-type semiconductor layer comprises a p-type contact layer in contact with the electron blocking layer.

* * * * *